United States Patent
Sugiura et al.

(10) Patent No.: US 6,467,491 B1
(45) Date of Patent: Oct. 22, 2002

(54) PROCESSING APPARATUS AND PROCESSING METHOD

(75) Inventors: Masahito Sugiura, Yamanashi; Hiroshi Shinriki, Chiba; Hideki Kiryu; Shintaro Aoyama, both of Yamanashi, all of (JP)

(73) Assignee: Tokyo Electron Limited, Tokyo (JP)

( * ) Notice: Subject to any disclaimer, the term of this patent is extended or adjusted under 35 U.S.C. 154(b) by 25 days.

(21) Appl. No.: 09/631,978

(22) Filed: Aug. 3, 2000

Related U.S. Application Data (63) Continuation of application No. PCT/JP00/03018, filed on May 11, 2000.

(30) Foreign Application Priority Data

May 4, 1999 (JP) .......................................... 11-134684
Oct. 6, 1999 (JP) .......................................... 11-285612

(51) Int. Cl.$^7$ ................................................ B08B 7/04
(52) U.S. Cl. ......................... 134/1.3; 134/32; 134/902; 156/345.5; 156/345.32
(58) Field of Search .............................. 134/1, 1.3, 18, 134/19, 21, 32, 34, 902; 438/906; 156/345, 345.5, 345.54, 345.37, 345.31, 345.32; 118/719, 722

(56) References Cited

U.S. PATENT DOCUMENTS

| | | | | |
|---|---|---|---|---|
| 5,228,206 A | * | 7/1993 | Grant et al. ................... | 34/275 |
| 5,972,161 A | * | 10/1999 | Kim et sl. ................... | 118/719 |
| 6,143,081 A | * | 11/2000 | Shinriki et al. .............. | 118/715 |
| 6,178,660 B1 | * | 1/2001 | Emmi et al. .................. | 34/216 |
| 6,204,120 B1 | * | 3/2001 | Gilboa et al. ................ | 438/255 |
| 6,232,248 B1 | * | 5/2001 | Shinriki et al. .............. | 438/680 |

FOREIGN PATENT DOCUMENTS

| | | | |
|---|---|---|---|
| JP | 58-58726 | * | 4/1983 |
| JP | 03-263320 | * | 11/1991 |
| WO | WO 00/70666 | * | 11/2000 |

* cited by examiner

Primary Examiner—Alexander Markoff
(74) Attorney, Agent, or Firm—Finnegan, Henderson, Farabow, Garrett & Dunner, LLP (57) ABSTRACT

A pretreatment chamber 120 is disposed within a vacuum transfer chamber 102 of a processing apparatus 100. The pretreatment chamber 120 is equipped with an orienting mechanism 128 and a UV lamp 124. The orienting mechanism 128 orients a wafer W through rotation of a table 130, on which the wafer W is placed, and by use of an optical sensor 134. Synchronously with the orientation, the UV lamp 124 emits UV through a UV transmission window 126 fitted to a ceiling portion of the pretreatment chamber 120, to thereby irradiate the surface of the wafer W with UV. Thus adhering to the wafer W is removed. A processing gas supplied into the pretreatment chamber 120 is also irradiated with UV. Active atoms generated from the processing gas also contribute to removal of carbon. Since the pretreatment chamber 120 is formed within the vacuum transfer chamber 102, the footprint of the processing apparatus can be reduced. Since orientation of the wafer W and removal of contaminants are performed concurrently, throughput is improved.

7 Claims, 12 Drawing Sheets

PROCESSING APPARATUS AND PROCESSING METHOD

This application is a continuation of international Application No. PCT/JP00/03018, filed May 11, 2000, the content of which is incorporated herein by reference.

TECHNICAL FIELD

The present invention relates to a processing apparatus and method for, for example, subjecting an object to be processed, such as a silicon wafer, to CVD and etching. More particularly, the invention relates to a processing apparatus and method involving irradiation of the surface of an object to be processed with ultraviolet light.

BACKGROUND ART

In fabrication of semiconductor devices, an object to be processed (hereinafter called merely a wafer), such as a semiconductor wafer, is subjected to various kinds of processes, such as oxidation and film formation, by use of a plurality of vacuum processing apparatus. Recently, there has been proposed a multi-chamber processing apparatus: which has a so-called cluster structure and which can perform a plurality of processes within a single apparatus.

The multi-chamber processing apparatus includes a vacuum transfer chamber serving as a central chamber, a plurality of vacuum processing chambers for performing various processes, and a cassette chamber for loading/unloading an object to be processed.

A transfer mechanism, such as a transfer arm, for transferring a wafer, and a mechanism for orienting a wafer are disposed within the vacuum transfer chamber. A space for transferring a wafer by means of the transfer arm must be provided within the vacuum transfer chamber. Accordingly the processing apparatus involves a problem in that its footprint (area occupied for installation) increases. Particularly, with the recent tendency toward increase in wafer size, this problem is worsening.

When the surface of a wafer to be processed has impurities, such as an organic substance, adhering thereto, defective semiconductor devices are likely to result at high probability. Therefore, the surface of a wafer must be subjected to various kinds of processes so as to be kept clean.

In order to clean the surface of a wafer to be processed, the surface is pretreated;. specifically, irradiated with ultraviolet light so as to decompose an organic substance adhering thereto. For example, Japanese Patent Application Laid-Open (kokai) No. 58726/1983 discloses an apparatus involving irradiation of the surface of a wafer with ultraviolet light. Specifically, a plasma reactor includes a ultraviolet-light irradiation unit disposed between a processing unit and an unloader. The ultraviolet-light irradiation unit irradiates the surface of a wafer with ultraviolet light each time a wafer held by a transfer arm passes the unit.

In the disclosed apparatus, the entire transfer section is enclosed by a housing, and after being loaded into the housing, a wafer is irradiated with ultraviolet light during the transfer step. Thus, the overall structure of the apparatus is complex.

Involvement of the step for loading a wafer into and unloading from the housing increases the total number of steps for processing a wafer, causing difficulty in improving throughput.

The present invention has been accomplished in view of the above-mentioned problems in the conventional processing apparatus. An object of the present invention is to provide a novel, improved processing apparatus capable of solving the above-mentioned problems and other problems.

DISCLOSURE OF THE INVENTION

To achieve the above object, according to a first aspect of the present invention, there is provided a processing apparatus comprising a transfer chamber, which comprises transfer means for transferring an object to be processed, and one or more vacuum processing chambers, which are disposed around the transfer chamber and adapted to process the object to be processed. The processing apparatus is characterized in that a pretreatment chamber for irradiating the object to be processed with ultraviolet light is disposed within the transfer chamber.

According to the present invention, the pretreatment chamber is disposed within the transfer chamber, thereby decreasing the footprint of the processing apparatus. Another processing chamber can be disposed at a peripheral space of the transfer chamber, which is conventionally occupied by a pretreatment chamber.

Since the pretreatment chamber is disposed outside an object transfer path extending between the transfer chamber and each of the processing chambers, a transferring operation effected by the transfer means is not obstructed, and the size of the transfer chamber remains unchanged. Since an object to be processed can be transferred directly from the pretreatment chamber within the transfer chamber to a processing chamber, the transfer distance of a transfer arm can be decreased as compared to the case where the pretreatment chamber is disposed outside the transfer chamber, thereby improving throughput.

In order to decrease the size of the pretreatment chamber through reduction of members to be disposed within the pretreatment chamber, it is preferable that ultraviolet-light generation means for generating ultraviolet light be disposed outside the pretreatment chamber, while an ultraviolet-light transmission window is provided on a wall of the pretreatment chamber so as to introduce ultraviolet light into the pretreatment chamber.

The pretreatment chamber may comprise gas supply means for supplying thereinto a processing gas to be activated by ultraviolet light. In this case, contaminants adhering to an object to be processed can be removed not only through irradiation with the ultraviolet light but also by means of active atoms generated from the processing gas, thereby reliably performing decontamination.

Preferably, the pretreatment chamber comprises orienting means for orienting an object to be processed, thereby avoiding separate disposition of the pretreatment chamber and the orienting means within the transfer chamber. Accordingly, the size of the transfer chamber is decreased, thereby further decreasing the footprint of the processing apparatus. This configuration enables an object to be processed to concurrently undergo orientation and exposure to ultraviolet light, thereby improving throughput.

According to a second aspect of the present invention, there is provided a processing apparatus comprising a transfer chamber, which comprises transfer means for transferring an object to be processed, and one or more vacuum processing chambers, which are disposed around the transfer chamber and adapted to process the object to be processed. The processing apparatus is characterized in that an ultraviolet-light irradiation apparatus is disposed along an object transfer path extending between the transfer chamber and each of the processing chambers.

In this processing apparatus, the ultraviolet-light irradiation apparatus may be disposed in any of the following manners: above the object transfer path located within each of the processing chambers; above the object transfer path located within the transfer chamber; and above the object transfer path located within each of the processing chambers, as well as above the object transfer path located within the transfer chamber.

According to third and fourth aspects of the present invention, there is provided a processing method comprising a step of irradiating an object to be processed with ultraviolet light in the course of transfer of the object held by an arm between a processing chamber and a transfer chamber. The processing .method is characterized in that irradiation of the object with ultraviolet light is turned on and off synchronously with the operation of the arm.

Alternatively, an ultraviolet lamp is turned on and off synchronously with opening/closing of a door.

According to the present invention, the ultraviolet-light irradiation apparatus is disposed above the object transfer path, thereby irradiating an object to be processed with ultraviolet light efficiently and in a simple manner. Also, an object to be processed can be irradiated with ultraviolet light while being transferred swiftly.

BEST MODE FOR CARRYING OUT THE INVENTION

A processing apparatus of the present invention embodied in the form of a multi-chamber processing apparatus will next be described in detail with reference to the drawings.

(1) First Embodiment

Figure 1:
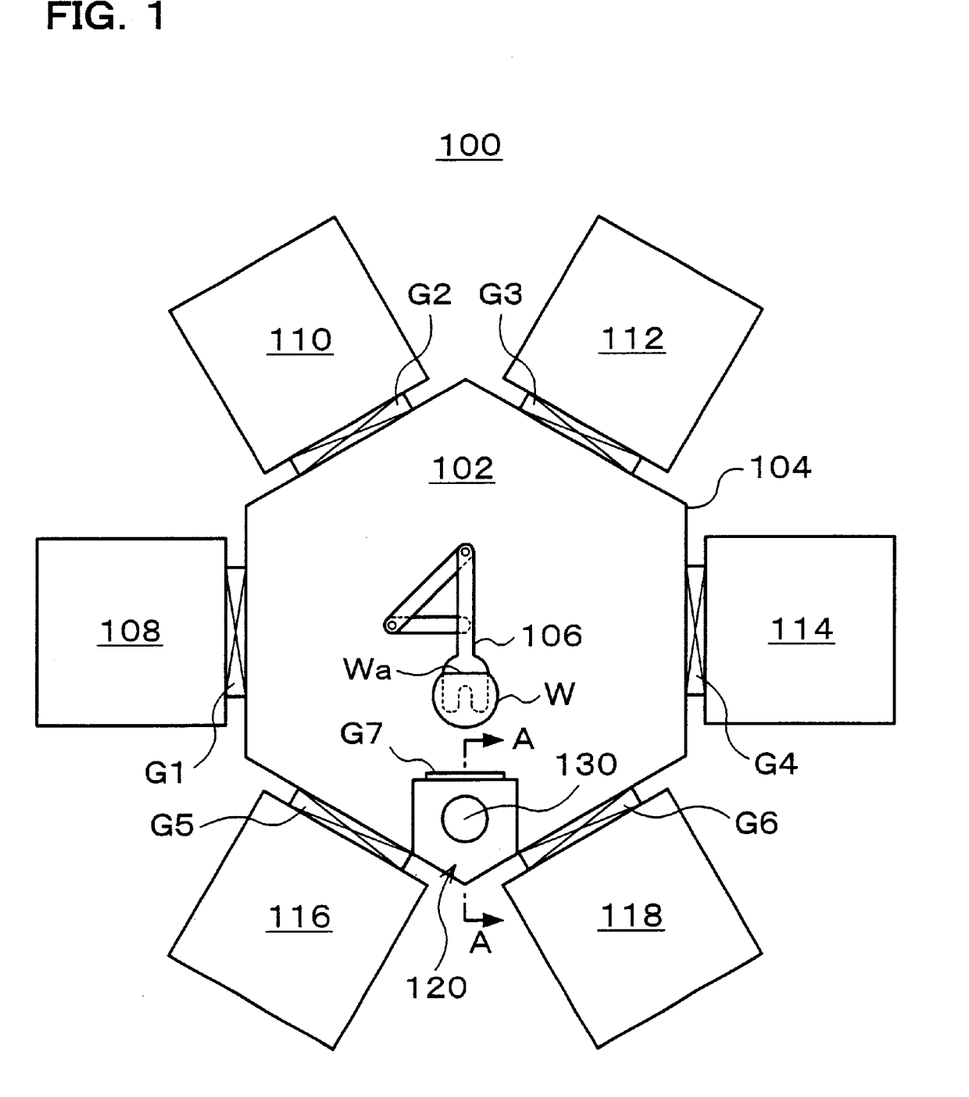
FIG. 1 is a schematic plan view showing a processing apparatus according to a first embodiment of the present invention.

First, the configuration of a processing apparatus 100 according to a first embodiment of the present invention will be outlined. As shown in FIG. 1, a vacuum transfer chamber 102 is formed within an airtight transfer container 104. A transfer arm 106 for transferring a wafer W is disposed within the vacuum transfer chamber 102. The transfer arm 106 can rotate horizontally and move vertically. A pretreatment chamber 120 is disposed within the vacuum transfer chamber 102 and is adapted to remove an adhering contaminant from the surface of the wafer W while orienting the wafer W. The structure of the pretreatment chamber 120 will be described later in detail.

First through third vacuum processing chambers 108, 110, and 112 for subjecting the wafer W to the respective processes, a cooling chamber 114 for cooling the wafer W, and first and second cassette chambers 116 and 118 in which an unillustrated cassette for accommodating a plurality of wafers W is disposed, are disposed around the vacuum transfer chamber 102 in such a manner as to be connected to the vacuum transfer chamber 102 via gate valves G1 to G6, respectively. In the first vacuum processing chamber 108, while, for example, $O_2$ or NO is used as a processing gas, the wafer W is heated to a temperature of about 600° C. to 700° C. to thereby form a gate oxide film on the wafer W through oxidation or nitriding. In the second vacuum chamber 110, while, for example, $Ta(OC_2H_5)_5$ is used as a processing gas, the wafer W is heated to a temperature of about 480° C. to thereby form a $Ta_2O_5$ film on the wafer W. In the third vacuum chamber 112, while, for example, $WF_6$ and $NH_3$ are used as a processing gas, the wafer W is heated to a temperature of about 400° C. to thereby form a WN film on the wafer W, with resultant formation of a gate electrode.

The processing apparatus 100 according to the present embodiment is configured as described above. Next, the configuration of the pretreatment chamber 120 will be described in detail.

Figure 2:
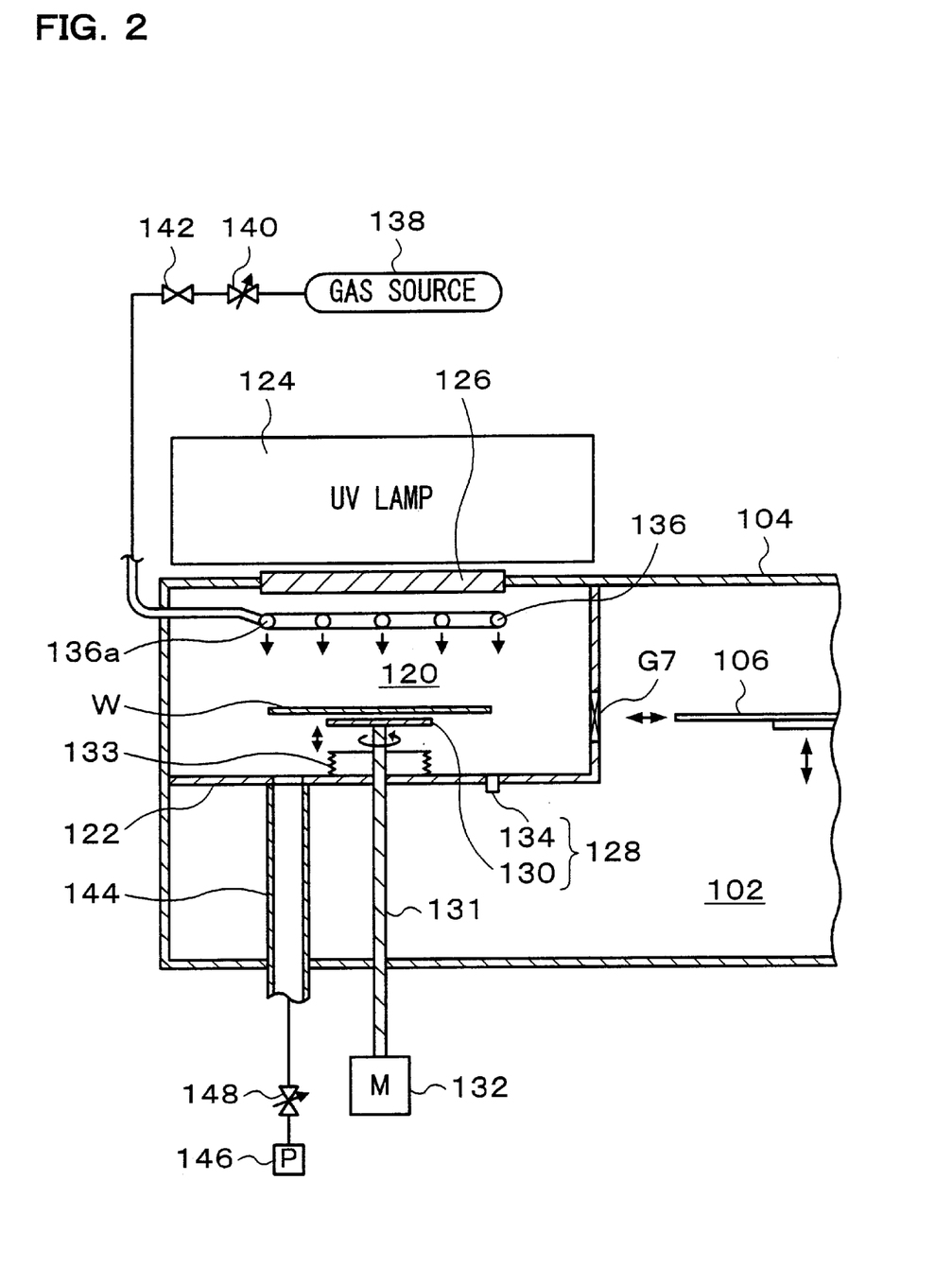
FIG. 2 is a schematic sectional view of a pretreatment chamber of the processing apparatus taken along line A—A of FIG. 1.

As shown in FIG. 1, the pretreatment chamber 120 is located so as not to obstruct a transfer action of the transfer arm 106 which is in a contracted state and holds the wafer W; for example, at a position where an orienting mechanism is conventionally disposed. Specifically, the pretreatment chamber 120 is disposed in the vicinity of the inner side wall of the vacuum transfer chamber 102 and between the gate valve G5 of the first cassette chamber 116 and the gate valve G6 of the second cassette chamber 118. As shown in FIG. 2, the pretreatment chamber 120 is enclosed by a treatment container 122 of aluminum and a wall portion of the transfer container 104, to thereby be airtightly separated from the vacuum transfer chamber 102. Notably, the surface of the treatment container 122 is, for example, anodized. A gate valve G7 is provided in a freely openable manner on a side wall of the pretreatment chamber 120 so as to airtightly isolate the pretreatment chamber 120 from the vacuum transfer chamber 102. By virtue of this configuration, when the gate valve G7 is opened, the wafer W can be transferred between the vacuum transfer chamber 102 and the pretreatment chamber 120 by means of the transfer arm 106. When the gate valve G7 is closed, the pretreatment chamber 120 is held airtight, thereby preventing contamination of the vacuum transfer chamber 102 which would otherwise be result from flow into the vacuum transfer chamber 102 of gas containing contaminants which have been removed from the wafer W during pretreatment.

An orienting mechanism 128, serving as orienting means for orienting the wafer W, is disposed within the pretreatment chamber 120. The orienting mechanism 128 includes a table 130 and an optical sensor 134. The table 130 is adapted to horizontally rotate the wafer W placed thereon and is connected to a drive mechanism M 132 via a drive shaft 131 so as to be operated by the drive mechanism M 132. Furthermore, the table 130 is vertically movable by means of the drive mechanism M 132. Through employment of this configuration, the distance between the wafer W placed on the table 130 and a UV lamp 124, which will be described later, can be adjusted as adequate. A portion of the drive shaft 131 which extends within the pretreatment chamber 120 is enclosed by bellows 133 formed of an extensible airtight member. The optical sensor 134 is adapted to detect the orientation of an orientation flat Wa formed on the wafer W. Through orientation based on the detected information, the wafers W which are transferred sequentially can be oriented in the same direction.

UV generation means for emitting ultraviolet light (hereinafter called UV) of, for example, 172 nm to 360 nm, is disposed above the pretreatment chamber 120 and outside the transfer container 104. An example of the UV generation means includes a UV lamp 124 such as a low-pressure mercury lamp or an electrodes lamp. A UV transmission window 126 is fitted to an upper wall of the transfer container 104 serving as the ceiling of the pretreatment chamber 120. The UV transmission window 126 is formed of a material capable of sufficiently transmitting into the pretreatment chamber 120 UV emitted from the UV lamp 124. An example of such a material is synthetic quartz. The size of the UV transmission window 126 is determined so as to sufficiently irradiate the entire surface of the wafer W with UV. Through employment of this configuration, the upper surface of the wafer W placed on the table 130 is irradiated uniformly with UV emitted from the UV lamp 124 via the UV transmission window 126. As a result, energy of UV cuts off a chemical bond between the surface of the wafer W and an adhering contaminant; for example, an organic substance, such as carbon, thereby removing the contaminant.

A gas supply portion 136 having a plurality of gas discharge holes 136a formed therein is disposed within the pretreatment chamber 120 and between the UV transmission window 126 and the table 130. Notably, the gas supply portion 136 is located so as not to obstruct a transfer action of the transfer arm 106. In order to avoid interruption of irradiation of the wafer W with UV and to allow irradiation of a processing gas with UV, the gas supply portion 136 is formed of the same material as that of the UV transmission window 126, for example, synthetic quartz. A processing gas, for example, $O_2$, $O_3$, $N_2$, or $Cl_2$, supplied from a gas source 138 is adjusted to a predetermined flow rate by means of a flow-regulating valve 140 and then passes through an on-off valve 142. The thus-supplied processing gas is discharged uniformly over the entire surface of the wafer W through the gas discharge holes 136a. Through supply of the processing gas in cooperation with UV irradiation, the processing gas is irradiated with UV to thereby generate active atoms. The active atoms reliably enhance removal of adhering contaminants from the surface of the wafer W. As mentioned above, the UV lamp 124 is disposed outside the pretreatment chamber 120, thereby preventing damage to the UV lamp 124 which would otherwise result from exposure to the active atoms.

A gas contained in the pretreatment chamber 120 is evacuated through an evacuation pipe 144 connected to a lower portion of the pretreatment chamber 120 by means of a vacuum pump 146. Thus, the gas which contains contaminants removed through pretreatment can be evacuated quickly and reliably, thereby preventing contamination of the vacuum transfer chamber 102 with the gas containing contaminants which would otherwise result when the gate valve G7 is opened. The pressure of the pretreatment chamber 120 is adjusted to a predetermined value by means of an evacuation-regulating valve 148 installed on the evacuation pipe 144. By holding the pressure of the pretreatment chamber 120 lower than that of the vacuum transfer chamber 102, the gas contained in the pretreatment chamber 120 does riot flow into the vacuum transfer chamber 102 even when the gate valve G7 is opened. As a result, contamination of the vacuum transfer chamber 102 can be prevented reliably.

Next, in order describe the operation of the processing apparatus 100 configured as described above, formation of a gate oxide film and a gate electrode on the. wafer W will be described, by way of example, with reference to FIGS. 1 and 2.

First, the transfer arm 106 transfers the wafer W into the vacuum transfer chamber 102 from either the first cassette chamber 116 or the second cassette chamber 118 and then transfers the wafer W into the pretreatment chamber 120 through the opened gate valve G7. After the wafer W is placed on the table 130, the gate valve G7 is closed. Next, the wafer W is rotated for orientation. At the same time, a processing gas is discharged through the gas discharge holes 136a and sprayed over the upper surface of the wafer W. Also, the processing gas and the upper surface of the wafer W are irradiated with UV emitted from the UV lamp 124, thereby removing adhering carbon from the surface of the wafer W.

Next, the gate valve G7 is opened. The wafer W which has been oriented and undergone removal of contaminants is transferred into the vacuum transfer chamber 102 from the pretreatment chamber 120 by means of the transfer arm 106. Subsequently, the wafer W is transferred into the first vacuum transfer chamber 108, in which a gate oxide film is formed on the wafer W through oxidation. This oxidation process is particularly susceptible to contaminants adhering to the surface of the wafer W. Thus, according to the present embodiment, the pretreatment chamber 120 is disposed within the vacuum transfer chamber 102 from which the wafer W can be swiftly transferred into the first vacuum processing chamber 108, thereby preventing adhesion of contaminants to the pretreated wafer W. Therefore, the wafer W can undergo oxidation in a desired manner.

Subsequently, the wafer W on which the gate oxide film is formed is transferred sequentially into the second and third vacuum processing chambers 110 and 112, by way of the vacuum transfer chamber 102. In the second and third vacuum processing chambers 110 and 112, a $Ta_2O_5$ film and a WN film are formed on the wafer W to thereby form a gate electrode on the wafer W. The wafer W on which the gate electrode has been formed is cooled to a predetermined temperature within the cooling chamber 114. Subsequently, the wafer W is transferred again into the first cassette chamber 116 or the second cassette chamber 118 in which the wafer W was formerly accommodated.

The present embodiment is configured as described above; specifically, the vacuum transfer chamber 102 accommodates the pretreatment chamber 120. Thus, for example, the second vacuum processing chamber 110 in which a $Ta_2O_5$ film is formed can be disposed at a position where a pretreatment chamber is conventionally disposed, thereby increasing the number of processes to be performed in the processing apparatus 100. Since orientation of the wafer W and removal of contaminants can be performed concurrently, time required for pretreatment can be reduced.

The above embodiment is described while mentioning a pretreatment chamber in which orientation of a wafer and removal of contaminants are performed concurrently. However, the present invention is not limited thereto. The present invention can be embodied such that the pretreatment chamber for performing removal of contaminants and the means for orienting a wafer are disposed separately from each other within the transfer chamber.

The above embodiment is described while mentioning an exemplary structure such that the UV lamp is disposed outside the transfer container. However, the present invention is not limited thereto. The present invention can be embodied such that the UV lamp is disposed within the pretreatment chamber.

The above embodiment is described while mentioning 6 vacuum processing chambers disposed around the vacuum transfer chamber. However, the present invention is not limited thereto. The present invention can be embodied such that 5 or fewer or 7 or more vacuum processing chambers are disposed around the transfer chamber.

The above embodiment is described while mentioning a transfer arm composed of a scalar (single) arm. However, the present invention is not limited thereto. The present invention can be embodied while employing, for example, a frog-leg arm or a batch arm capable of concurrently transferring a plurality of objects to be processed.

(2) Second Embodiment

Figure 3:
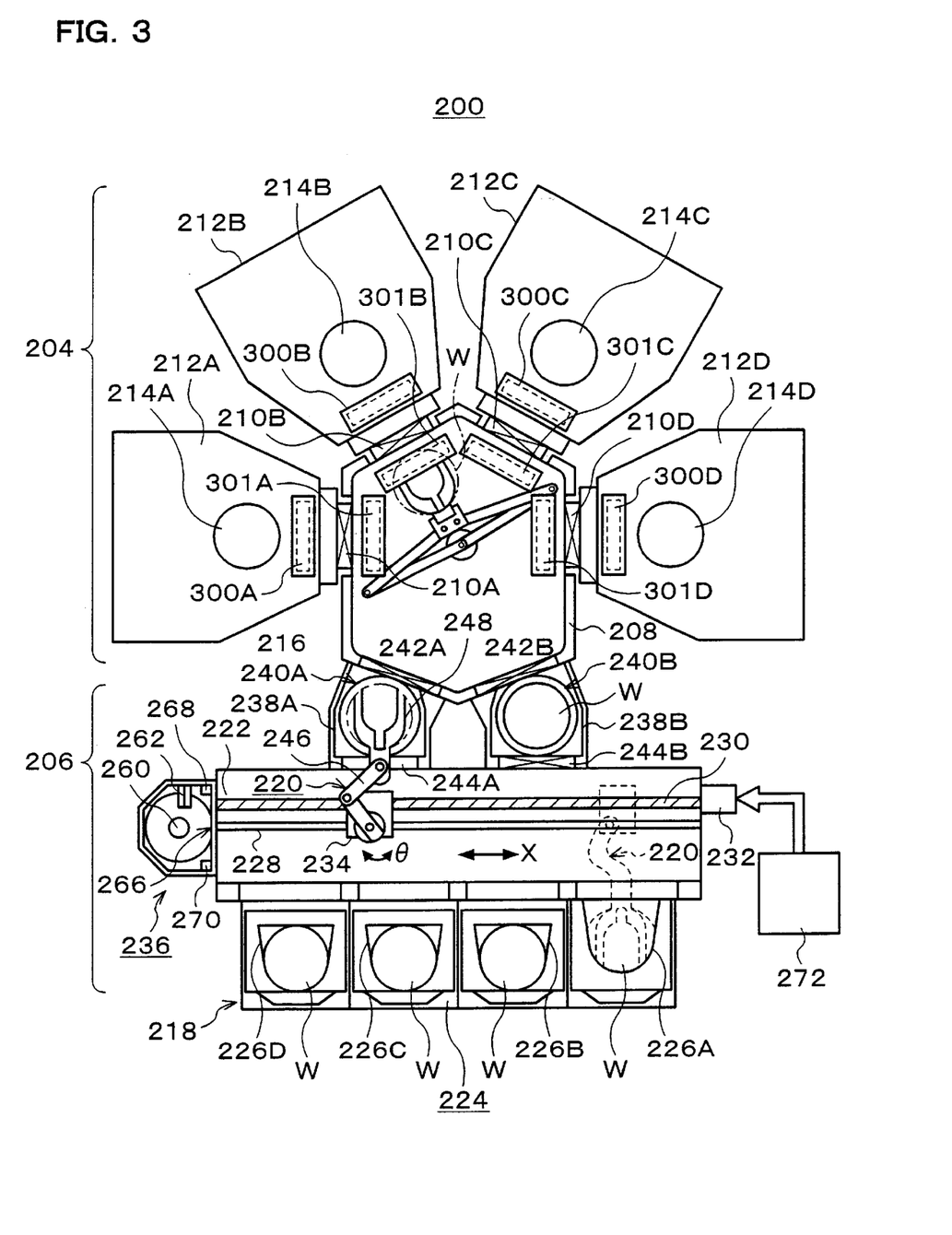
FIG. 3 is a schematic plan view showing a processing apparatus according to a second embodiment of the present invention.

Next, a second embodiment of the present invention will be described. FIG. 3 shows schematically the configuration of a cluster tool according to the present embodiment. A cluster tool 202 includes a processing system 204 and a transfer system 206. The processing system 204 performs various kinds of processes, such as film formation, diffusion, and etching, on the wafer W, which is an object to be processed. The transfer system 206 loads the wafer W into and unloads from the processing system 204.

The processing system 204 includes a transfer chamber 208 capable of being evacuated and four processing chambers 212A to 212D, which are connected to the transfer chamber 208 via gate valves 210A to 210D, respectively. The processing chambers 212A to 212D are adapted to perform the same kind of or different kinds of heat treatment on the wafer W. Susceptors 214A to 214D for holding the wafer W are disposed within the processing chambers 212A to 212D, respectively. A transfer arm 216, which can bend and stretch as well as rotate, is disposed within the transfer chamber 208 and is adapted to transfer the wafer W among the processing chambers 212A to 212 and between the processing chambers 212A to 212D and a load-lock chamber, which will be described later.

The transfer system 206 includes a cassette stage 218 for holding carrier cassettes and a transfer stage for moving a transfer arm 220 adapted to transfer the wafer W. A cassette table 224 is disposed on the cassette stage 218. A plurality of carrier cassettes (up to four carrier cassettes 226A to 226D in the illustrated example) can be placed on the cassette table 224. Each of the carrier cassettes 226A to 226D can accommodate up to, for example, 25 wafers W, which are stacked while being spaced equally.

A guide rail 228 extends longitudinally at a central portion of the transfer stage 222. The transfer arm 220 is slidably supported on the guide rail 228. This guide rail 228 is accompanied by, for example, a ball screw 230 serving as a moving mechanism. A base portion 234 of the transfer arm 220 is fitted to the ball screw 230. Accordingly, when a drive motor 232 disposed at an end portion of the ball screw 230 is rotated, the transfer arm 220 moves along the guide rail 228.

An orienter 236 for orienting the wafer W is disposed at the other end of the transfer stage 222. At an intermediate portion of the transfer stage 222, two load-lock chambers 238A and 238B capable of being evacuated so as to communicate with the transfer chamber 208 are disposed. Object tables 240A and 240B for holding the wafer W are disposed within the load-lock chambers 238A and 238B, respectively. In order to establish communication with the transfer chamber 208, gate valves 242A and 242B are disposed at the front side of the load-lock chambers 238A and 238B, respectively. In order to establish communication with the transfer stage 222, gate valves 244A and 244B are disposed at the rear side of the load-lock chambers 238A and 238B, respectively.

Figure 4:
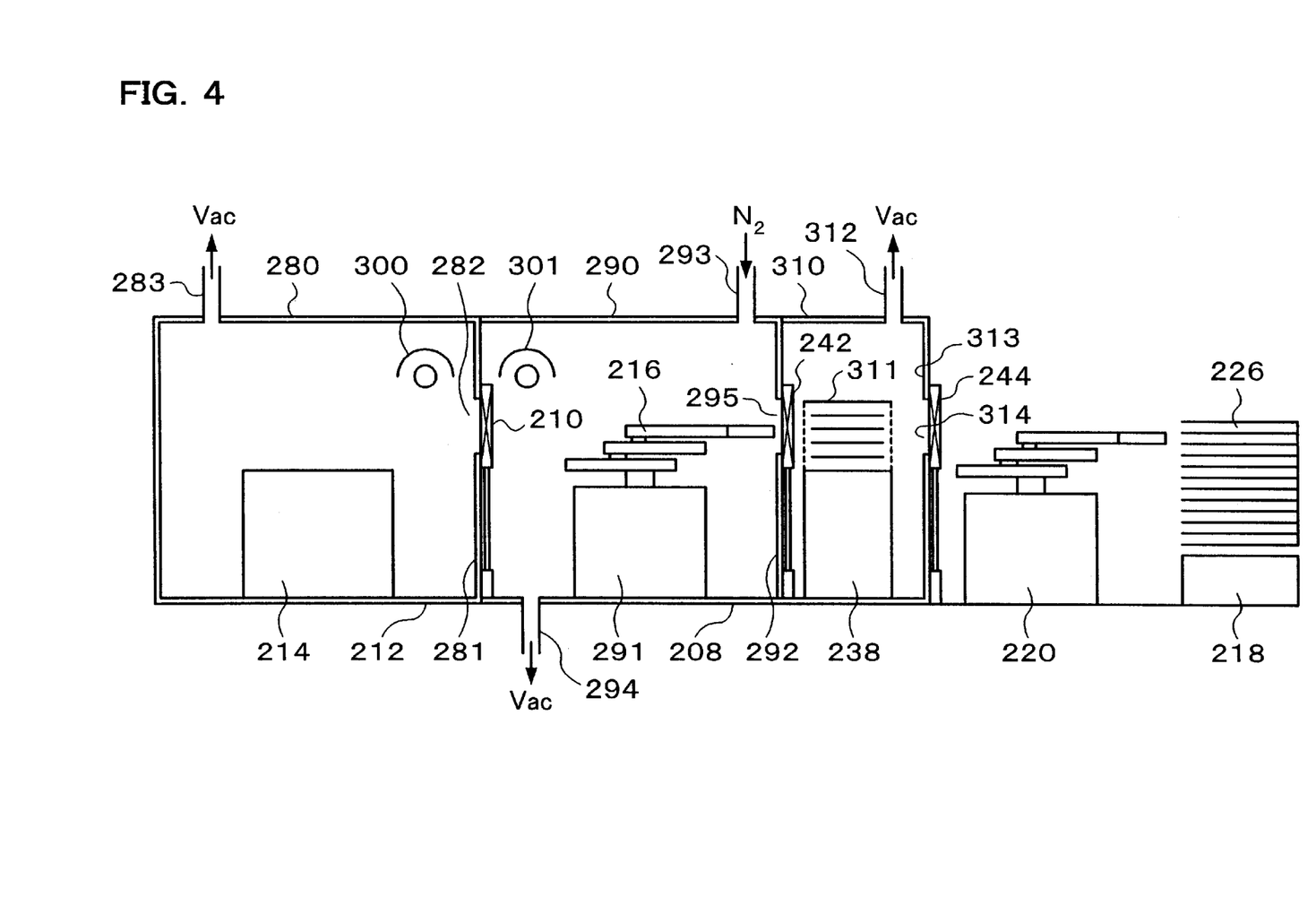
FIG. 4 is a vertical section of the processing apparatus of FIG. 3, showing positional relationship in the horizontal direction.

FIG. 4 is a vertical section of the cluster tool 202, showing positional relationship in the horizontal direction. As shown in FIG. 4, in the cluster tool 202, the transfer system 206 including the cassette stage 218, the transfer arm 220, and the load-lock chamber 238 is disposed at the right-hand end. At the left side of the transfer system 206, the transfer chamber 208 is disposed. Furthermore, a plurality of processing chambers 212A to 212D are disposed adjacent to the transfer chamber 208. For simplified illustration, FIG. 4 depicts the configuration such that only the processing chamber 212A is disposed at the left side of the transfer chamber 208; in other words, opposite the load-lock chamber 238 with respect to the transfer chamber 208.

As shown in FIG. 4, the processing chamber 212A is formed of a box-type housing 280 which can be made airtight. The susceptor 214A, on which the wafer W is placed for subjection to processing, is disposed at a central portion of the housing 280 of the processing chamber 212A. An opening portion 282 is formed in the vicinity of the center of a side wall 281 facing the adjacent transfer chamber 208. The wafer W can be transferred to and from the adjacent transfer chamber 208 through this opening portion 282.

This opening portion 282 can be opened and closed by means of a gate valve 210. An evacuation port 283 is formed on an upper portion of the housing 280. This evacuation port 283 is connected to an unillustrated vacuum pump so as to evacuate the processing chamber 212.

An ultraviolet-light irradiation unit 300 is disposed just above a transfer path extending between the opening portion 282 and the susceptor 214 for transfer of the wafer W. This ultraviolet-light irradiation unit 300 includes an elongated columnar ultraviolet lamp called an "excimer lamp" and a reflector disposed above the ultraviolet lamp. The surface of the wafer W in the process of transfer is irradiated with ultraviolet light emitted from the ultraviolet lamp.

The transfer chamber 208 illustrated at the center of FIG. 4 is formed of a box-type housing 290 which can be made airtight. A transfer mechanism 291 is disposed at the center of a bottom portion of the housing 290. A gas supply port 293 is formed on an upper portion of the housing 293. An unillustrated nitrogen gas supply system is connected to this gas supply port 293 so as to supply nitrogen gas into the transfer chamber 208 through the gas supply port 293. An evacuation port 294 is formed on a bottom portion of the housing 290. This evacuation port 294 is connected to an unillustrated vacuum pump so as to evacuate the transfer chamber 208.

An ultraviolet-light irradiation unit 301 is disposed just above a transfer path extending between the opening portion 282 and the transfer mechanism 291 for transfer of the wafer W. This ultraviolet-light irradiation unit 301 includes an elongated columnar ultraviolet lamp (excimer lamp) and a reflector disposed above the ultraviolet lamp. The surface of the wafer W in the process of transfer is irradiated with ultraviolet light emitted from the ultraviolet lamp.

An opening portion 295 is formed in the vicinity of the center of a side wall 292 of the housing 290 facing the adjacent load-lock chamber 238. The wafer W can be transferred to and from the adjacent load-lock chamber 238 through this opening portion 295. This opening portion 295 can be opened and closed by means of a gate valve 242, which can be moved vertically.

The load-lock chamber 238, which is disposed at the right side of the transfer chamber 208 in FIG. 4, is formed of a box-type housing 310. A holder bench 311 is disposed at the center of a bottom portion of the housing 310. An evacuation port 312 is formed on an upper portion of the housing 310. This evacuation port 312 is connected to an unillustrated vacuum pump so as to evacuate the load-lock chamber 238.

An opening portion 314 is formed in the vicinity of the center of a side wall 313 of the housing 310 facing the adjacent transfer arm 220. The wafer W can be transferred to and from the adjacent transfer mechanism 220 through this opening portion 314. This opening portion 314 can be opened and closed by means of a gate valve 244, which can be moved vertically.

The transfer arm, 220 is disposed at the right side of the load-lock chamber 238 in FIG. 4, and the cassette stage 218 is disposed at the right side of the transfer arm 220 in FIG. 4.

Next, the procedure for operating this cluster tool 202 will be described.

Figure 5:
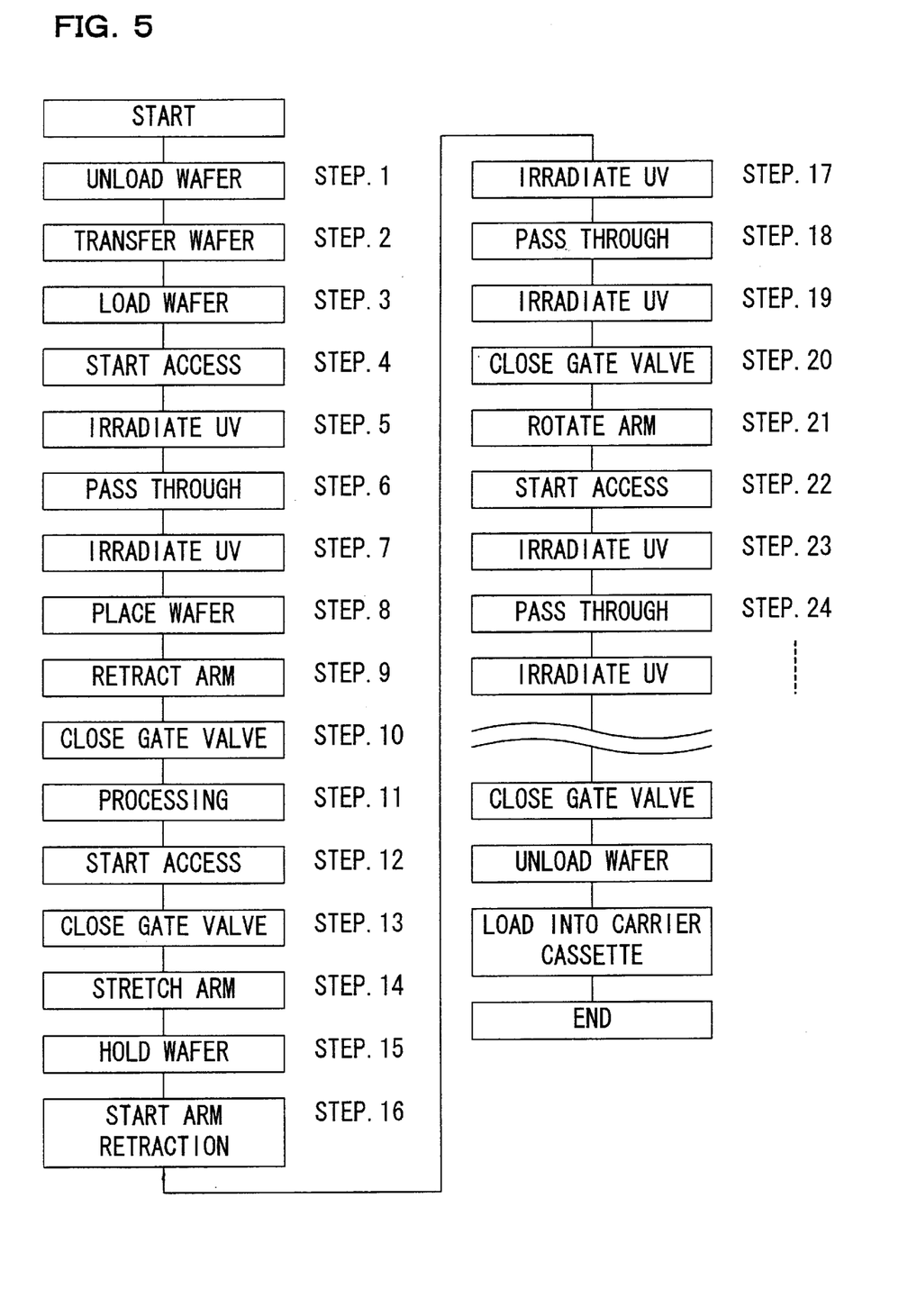
FIG. 5 is a flowchart showing a flow of operations of a processing method according to the second embodiment.

FIG. 5 is a flowchart showing a flow of operations according to the present embodiment.

When the cluster tool 202 is started, an unillustrated transfer robot places on the cassette stage 218 the carrier cassette 226 accommodating the wafers W to be processed.

After the carrier cassette 226 has been placed on the cassette stage 218, the transfer arm 220 accesses the carrier cassette 226 to thereby unload the wafer W to be processed from the carrier cassette 226 (STEP 1). The transfer arm 220 transfers into the load-lock chamber 238 the wafer W which was unloaded from the carrier cassette 226 (STEP 2). After the wafer W has been accommodated within the load-lock chamber 238, the gate valve 244 is closed. The load-lock chamber 238 is evacuated so as to establish environment similar to those of the subsequent transfer chamber 208 and processing chamber 212. After completion of adjustment of the environment within the load-lock chamber 238, the gate valve 242 is opened so as to establish communication between the load-lock chamber 238 and the transfer chamber 208. The transfer arm 216 disposed within the transfer chamber 208 accesses the load-lock chamber 238 and holds the wafer W present within the load-lock chamber 238. Then, the transfer arm 216 transfers the wafer W into the transfer chamber 208 from the load-lock chamber 238 (STEP 3).

Figure 6:
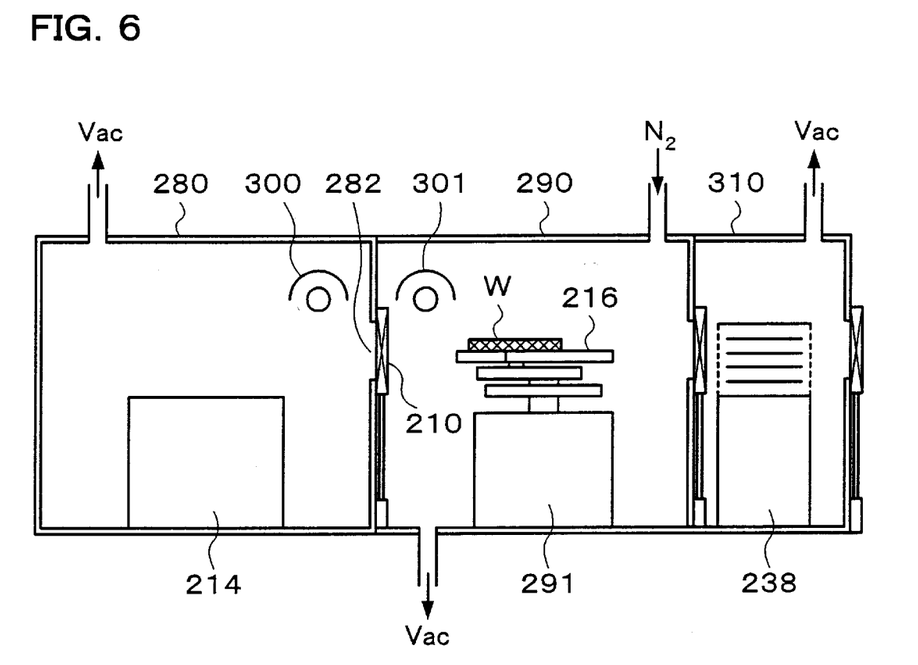
FIG. 6 is a vertical section showing one of the steps of the processing method according to the second embodiment.
Figure 7:
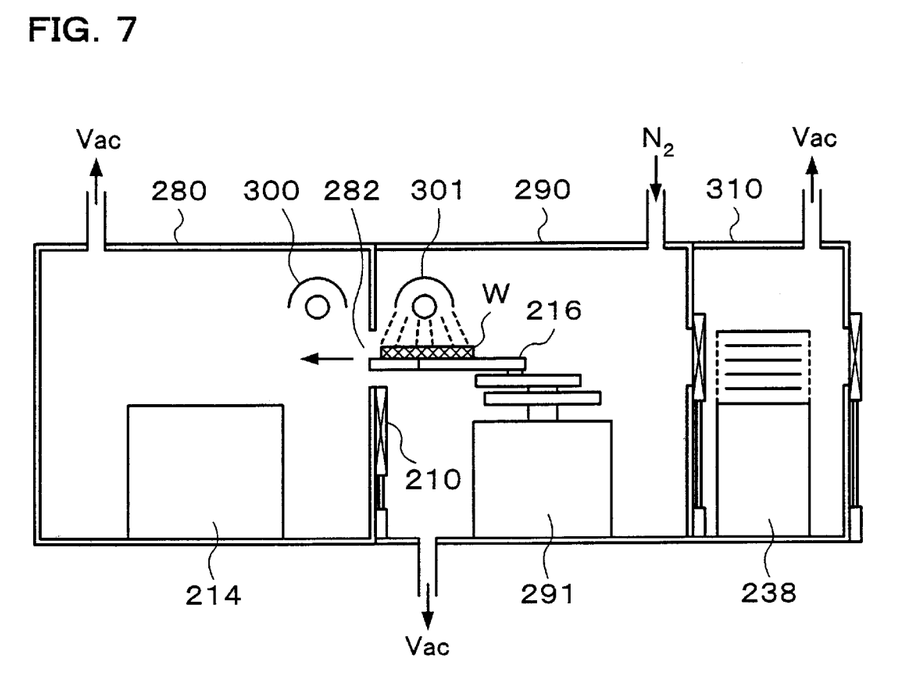
FIG. 7 is a vertical section showing one of the steps of the processing method according to the second embodiment.
Figure 8:
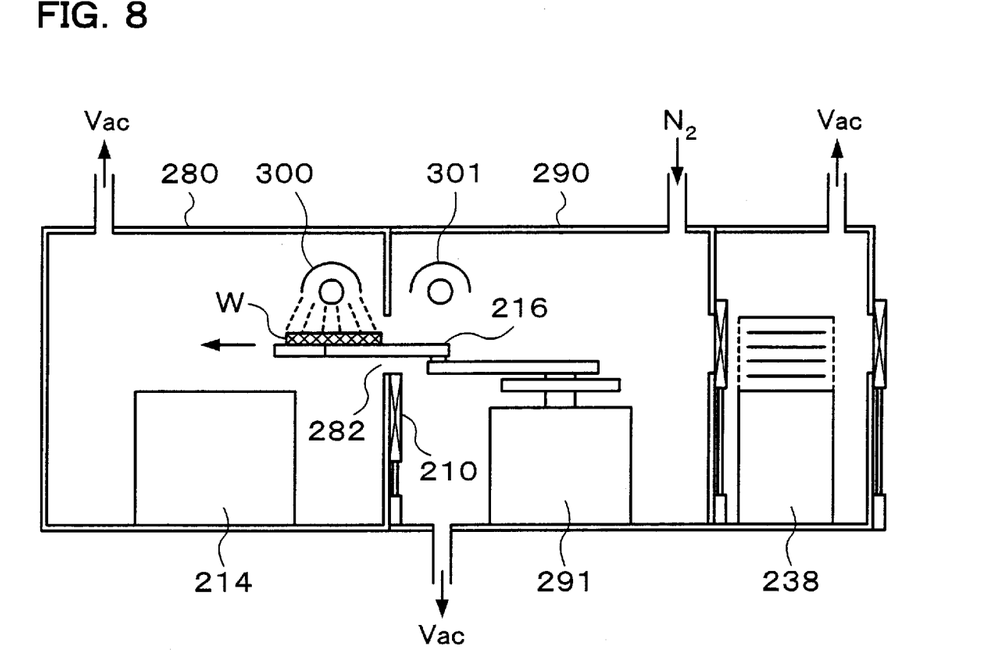
FIG. 8 is a vertical section showing one of the steps of the processing method according to the second embodiment.

After the wafer W has been loaded into the transfer room 208, the gate valve 242 is closed to thereby close up the transfer chamber 208 tight. At the same time, the transfer mechanism 291 for driving the transfer arm 216 operates so as to make the wafer W held by the transfer arm 216 stand by for transfer toward the processing chamber 212A (FIG. 6). Next, as soon as the gate valve 210 is opened, the transfer arm 216 starts accessing the processing chamber 212A (STEP 4). At this time, the accessing operation of the transfer arm 216 is synchronized with the on-off operation of the ultraviolet-light irradiation units 301A and 300A such that when the wafer W held at the end portion of the transfer arm 216 passes just under the ultraviolet-light irradiation units 301A and 300A, the surface of the wafer W is irradiated with ultraviolet light emitted from the ultraviolet-light irradiation unit. As shown in FIGS. 7 and 8, the wafer W is irradiated with ultraviolet light two consecutive times; specifically, in the course of transfer from the transfer chamber 208 to the processing chamber 212A while being held by the transfer arm 216, when the wafer W passes just under the ultraviolet-light irradiation unit 301A (STEP 5) and when the wafer W passes just under the ultraviolet-light irradiation unit 300A (STEP 6).

Figure 9:
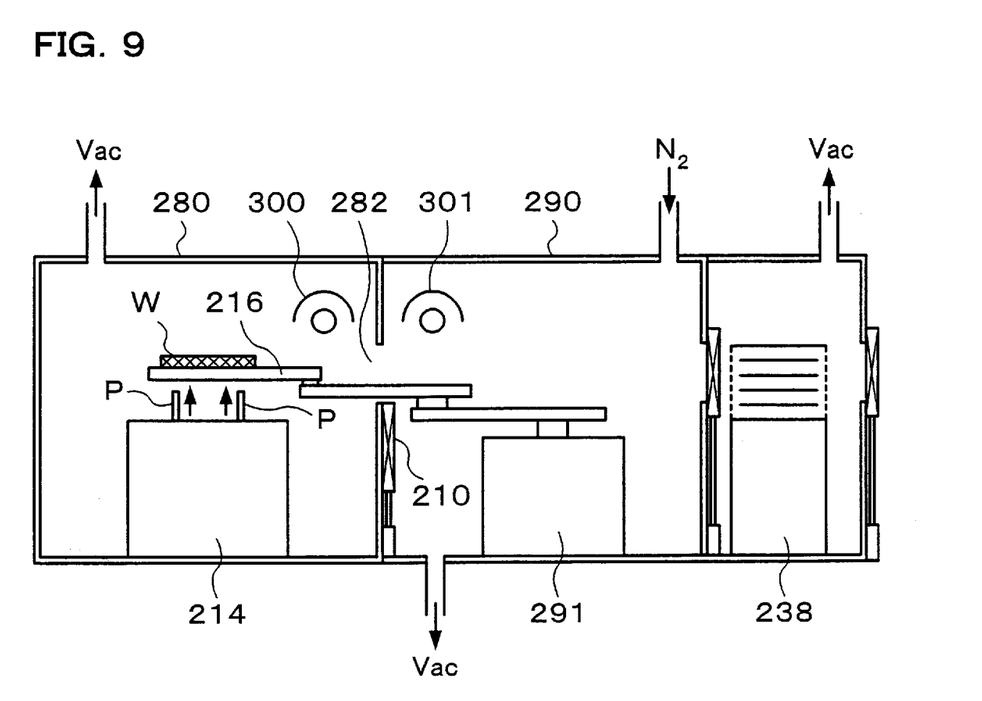
FIG. 9 is a vertical section showing one of the steps of the processing method according to the second embodiment.

After passing under the ultraviolet-light irradiation units 301A and 300A, the wafer W is transferred further into the processing chamber 212A until it reaches a position located just above the susceptor 214. Then, lift pins P rise so as to receive the wafer W to be processed from the transfer arm 216 (FIG. 9). When the lift pins P receive the wafer W from the transfer arm 216, the transfer arm 216 retracts. The lift pins P lower so as to place the wafer W on the susceptor 214 (STEP 8).

Figure 10:
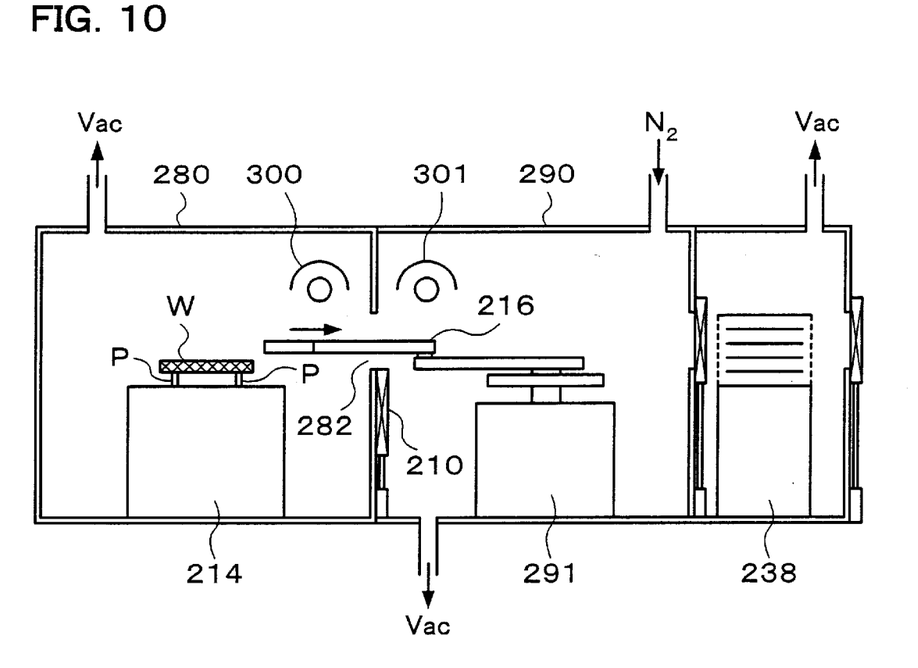
FIG. 10 is a vertical section showing one of the steps of the processing method according to the second embodiment.

After transferring the wafer W to the lift pins P, the transfer arm 216 moves in such a direction as to be accommodated within the transfer chamber 208, while bending a joint and turning about a shaft supported by the transfer mechanism 291 (FIG. 10 and STEP 9). At this time, the end portion of the transfer arm 216 passes again just under the ultraviolet-light irradiation units 300A and 301A. However, the ultraviolet-light irradiation units 300A and 301A are programmed so as not to go on when the end portion of the transfer arm 216 passes under them while holding no wafer W. Therefore, at this timing, the ultraviolet-light irradiation units 300A and 301A do not irradiate ultraviolet light. While the transfer arm 216 is in access to the processing chamber 212A, the gate valve 210 is lowered to thereby establish communication between the transfer chamber 208 and the processing chamber 212A through the opening portion 282. During a series of operations mentioned above, while inert gas, such as nitrogen gas, is supplied into the transfer chamber 208, the processing chamber 212A is maintained at a negative pressure by means of a vacuum system, thereby forming a continuous flow of gas from the transfer chamber 208 to the processing chamber 212A. Accordingly, dust, impurities, and other contaminations flow from the transfer chamber 208 to the processing chamber 212A. As a result, the transfer chamber 208 and the processing chamber 212A are always held in a clean state.

Figure 11:
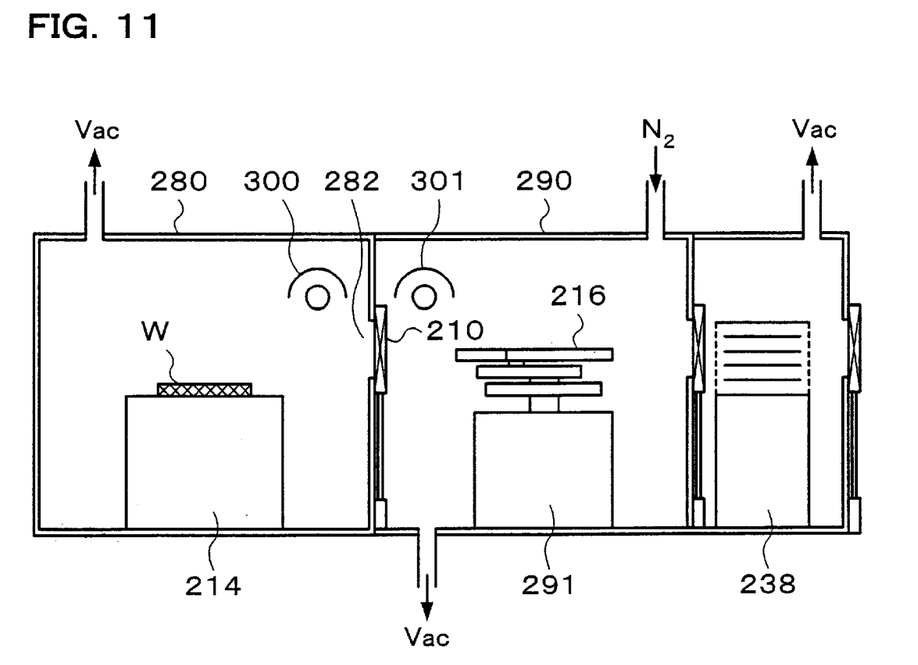
FIG. 11 is a vertical section showing one of the steps of the processing method according to the second embodiment.

After the entirety of the transfer arm 216 has been accommodated within the transfer chamber 208, the gate valve 210 rises to close the opening portion 282, thereby closing up the processing chamber 212A tight (FIG. 11 and STEP 10).

While the processing chamber 212A is closed up tight, a required processing environment is established. Specifically, the processing chamber 212A is evacuated or filled with a reactive gas so as to establish predetermined conditions, followed by processing of the wafer W placed on the susceptor 214 (FIG. 11 and STEP 11).

Figure 12:
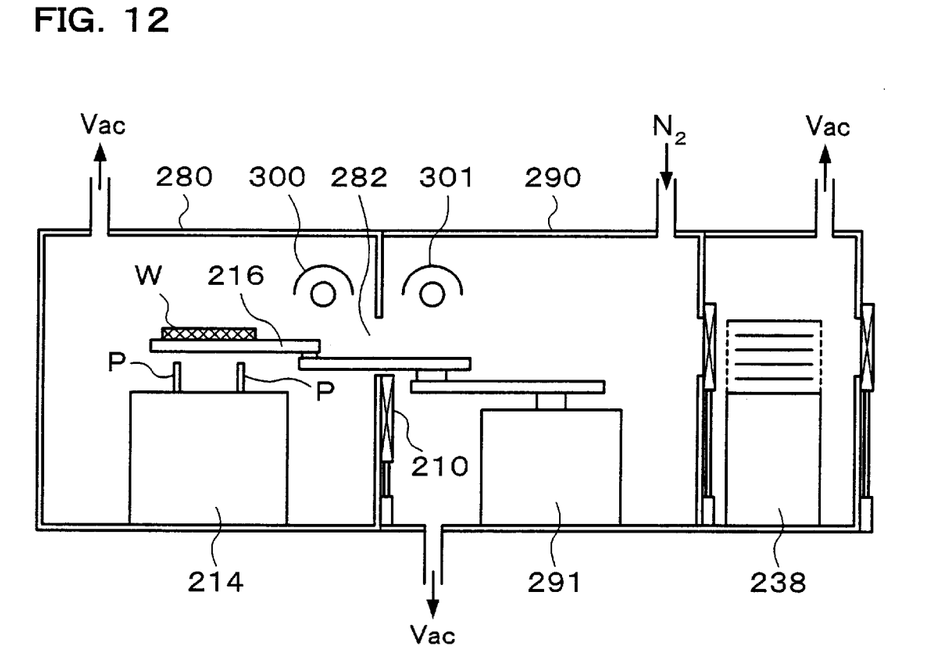
FIG. 12 is a vertical section showing one of the steps of the processing method according to the second embodiment.

In the processing chamber 212A, the wafer W is subjected to a predetermined processing; for example, removal of a natural oxide film effected by the CVD method. Upon completion of the processing, the gate valve 210 lowers again so as to open the opening portion 282. The transfer arm 216 accesses the processing chamber 212A. In the processing chamber 212A, the lift pins P rise so as to lift the processed wafer W. The end portion of the transfer arm 216 reaches under the wafer W, and the lift pins P lower, thereby transferring the wafer W from the lift pins P to the transfer arm 216 (FIG. 12 and STEPs 12 to 15).

Upon reception of the processed wafer W, the transfer arm 216 starts moving from the processing chamber 212A to the transfer chamber 208 while bending the joint and turning about the shaft supported by the transfer mechanism 291 (STEP 16).

Figure 13:
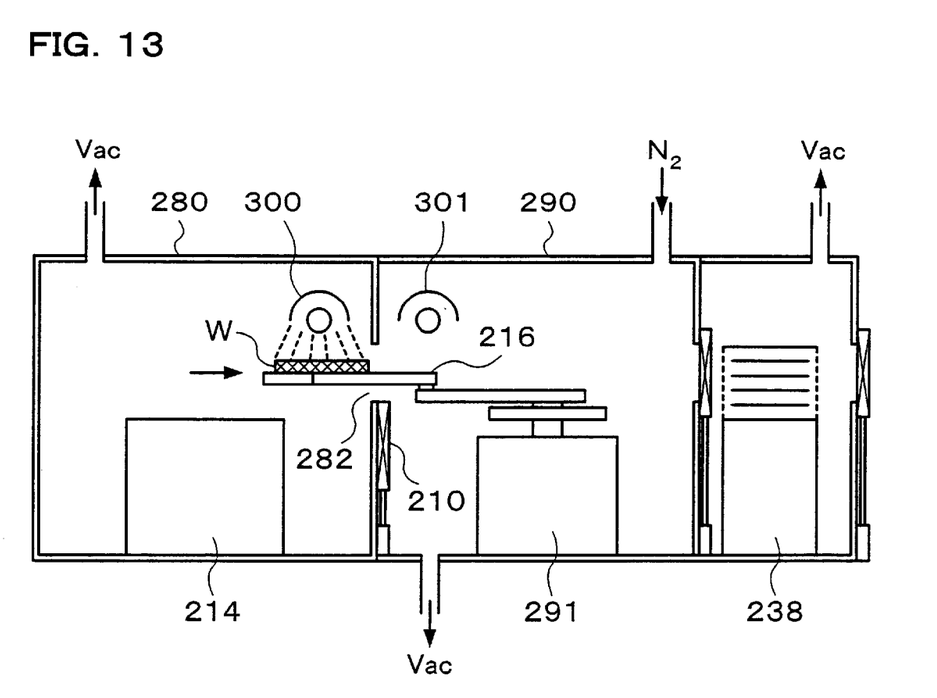
FIG. 13 is a vertical section showing one of the steps of the processing method according to the second embodiment.
Figure 14:
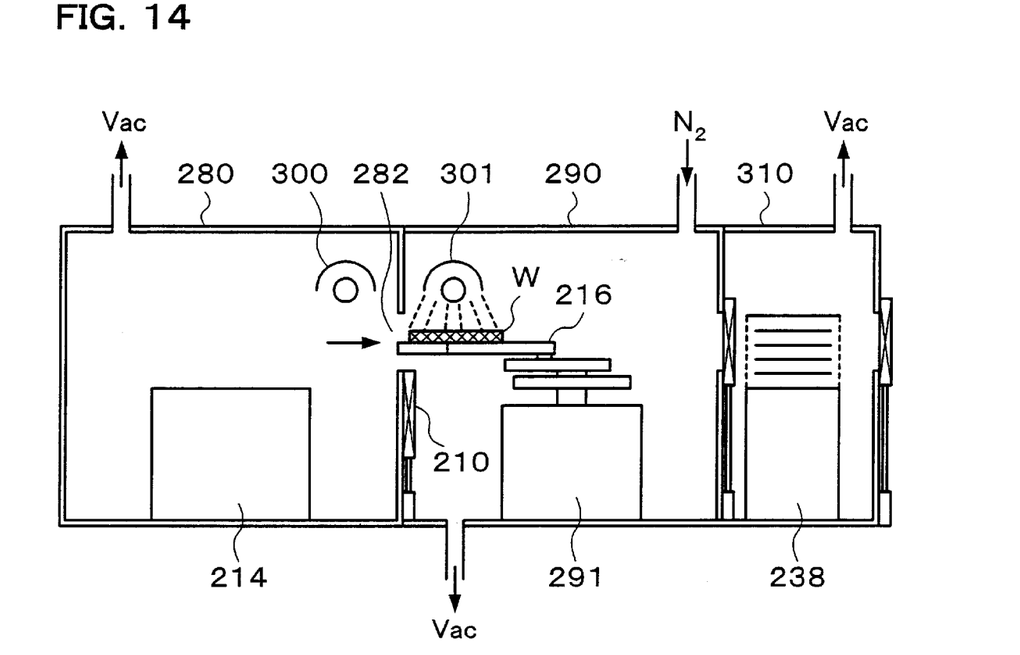
FIG. 14 is a vertical section showing one of the steps of the processing method according to the second embodiment.
Figure 15:
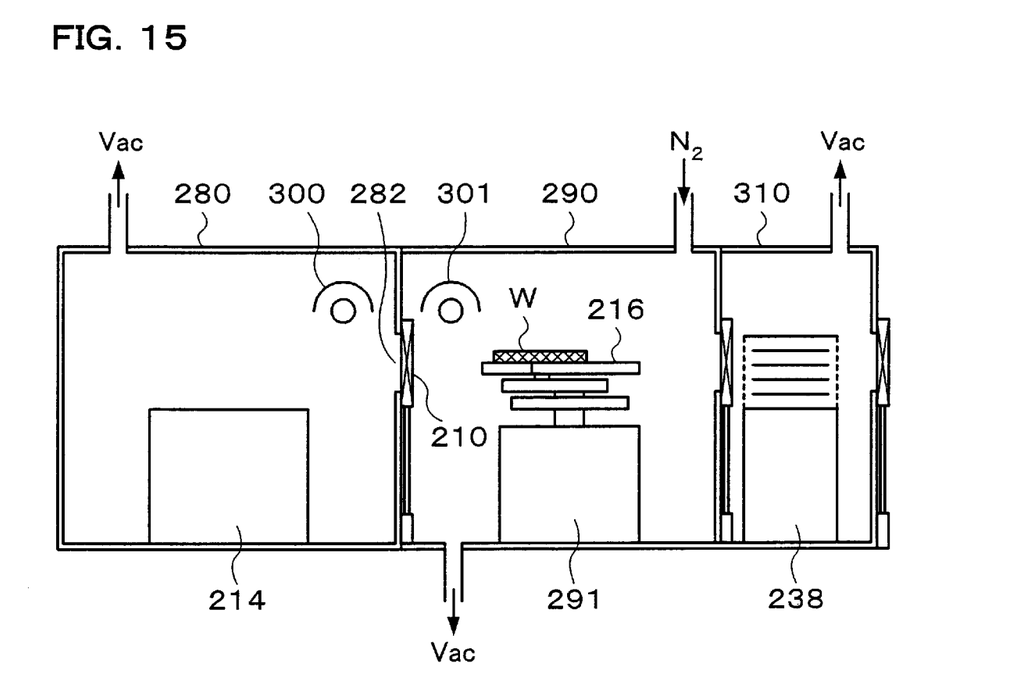
FIG. 15 is a vertical section showing one of the steps of the processing method according to the second embodiment.

As in the case of loading of the wafer W to be processed, when the wafer W held at the end portion of the transfer arm 216 passes just under the ultraviolet-light irradiation units 300A and 301A, the wafer W is irradiated with ultraviolet light emitted from the ultraviolet-light irradiation units 300A and 301A, since the movement of the transfer arm 216 is interlocked with the on-off operation of the ultraviolet-light irradiation units 300A and 301A. Accordingly, in the course of transfer of the processed wafer W from the processing chamber 212A to the transfer chamber 208, the processed wafer W is irradiated with ultraviolet light two consecutive times (FIGS. 13 and 14 and STEPS 17 to 19).

When, after the wafer W passes just under the ultraviolet-light irradiation unit 301A, the transfer arm 216 is accommodated completely within the transfer chamber 208, the gate valve 210 rises so as to close the opening portion 282, thereby completing processing associated with the processing chamber 212A (STEP 20).

Upon completion of processing associated with the processing chamber 212A, the transfer mechanism 291 operates so as to rotate the entirety of the transfer arm 216 by a predetermined angle, thereby directing the transfer arm 216 to a processing chamber for performing the next processing; for example, the processing chamber 212B (STEP 21).

Figure 16:
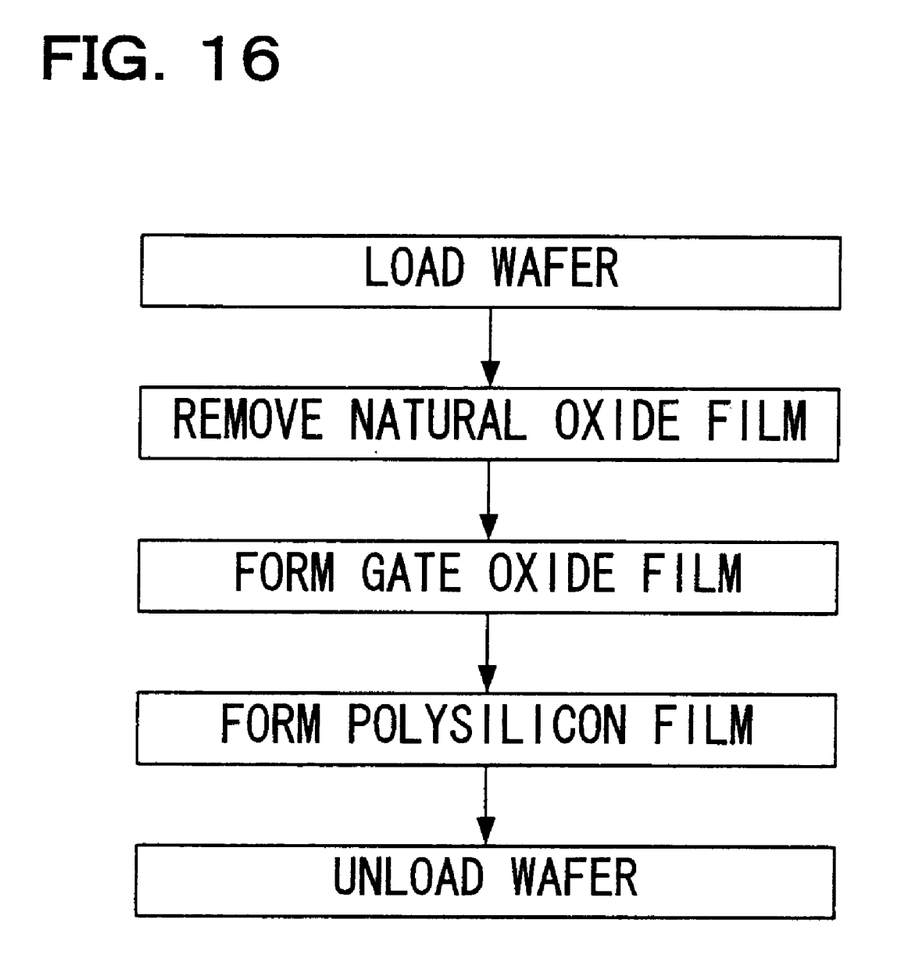
FIG. 16 is a flowchart showing a typical flow of wafer processing.

FIG. 16 is a flowchart showing a typical flow of processing to be performed on the wafer W.

As shown in FIG. 16, in the case of processing associated with the processing chamber 212B, as in the above-described case of processing, the wafer W is irradiated with ultraviolet light when passing just under the ultraviolet-light irradiation units 101B and 100B, twice; specifically, when the wafer W to be processed is loaded into the processing chamber 212B from the transfer chamber 208 and when the wafer W which has undergone processing performed within the processing chamber 212B; for example, formation of a gate oxide film, is unloaded from the processing chamber 212B into the transfer chamber 208. Accordingly, in the course of transfer of the wafer W to and from the processing chamber 212B, the wafer W is irradiated with ultraviolet light a total of four times.

Similarly, the wafer W is irradiated with ultraviolet light four times when a subsequent processing such as formation of polysilicon film is performed in each of the processing chambers 212C and 212D. Upon completion of a series of processing described above, the processed wafer W is unloaded from the transfer chamber 208 by way of the load-lock chamber 238 and is then accommodated into the carrier cassette 226, by means of the transfer arm 220.

As described in detail above, the processing method according to the present embodiment employs the ultraviolet-light irradiation units 300 and 301 disposed in the vicinity of a gate valve for connecting the transfer chamber 208 and each of the processing chambers 22. The on-off operation of the ultraviolet-light irradiation units 300 and 301 and the operation of the transfer arm 216 are synchronized such that each time the wafer W held on the transfer arm 216 passes just under the ultraviolet-light irradiation units 300 and 301, the surface of the wafer W is irradiated with ultraviolet light. Thus, the surface of the wafer W can be cleaned efficiently through irradiation with ultraviolet light without impairment in the transfer speed of the wafer W.

The above description of the present embodiment should not be construed as limiting the present invention. For example, the present embodiment is described while mentioning the ultraviolet-light irradiation units 101 and 100 which are disposed at a connection between the transfer chamber 208 and each of the processing chambers 212A to 12D such that the ultraviolet-light irradiation unit 101 is disposed on the side of the transfer chamber 208, while the ultraviolet-light irradiation unit 100 is disposed on the side of each of the processing chambers 212A to 12D. However, the ultraviolet-light irradiation units may be disposed only on the side of the transfer chamber 208 or only on the side of the processing chambers.

According to the above-described embodiment, the on-off operation of the ultraviolet-light irradiation units 300 and 301 and the operation of the transfer arm are synchronized such that when the wafer W passes just under the ultraviolet-light irradiation units 300 and 301, the surface of the wafer W is irradiated with ultraviolet light. However, the operation of the gate valve for establishing/canceling communication between the transfer chamber and each of the processing chambers and the on-off operation of the ultraviolet-light irradiation units may be synchronized such that when the wafer W passes just under the ultraviolet-light irradiation units 300 and 301, the surface of the wafer W is irradiated with ultraviolet light.

Figure 17:
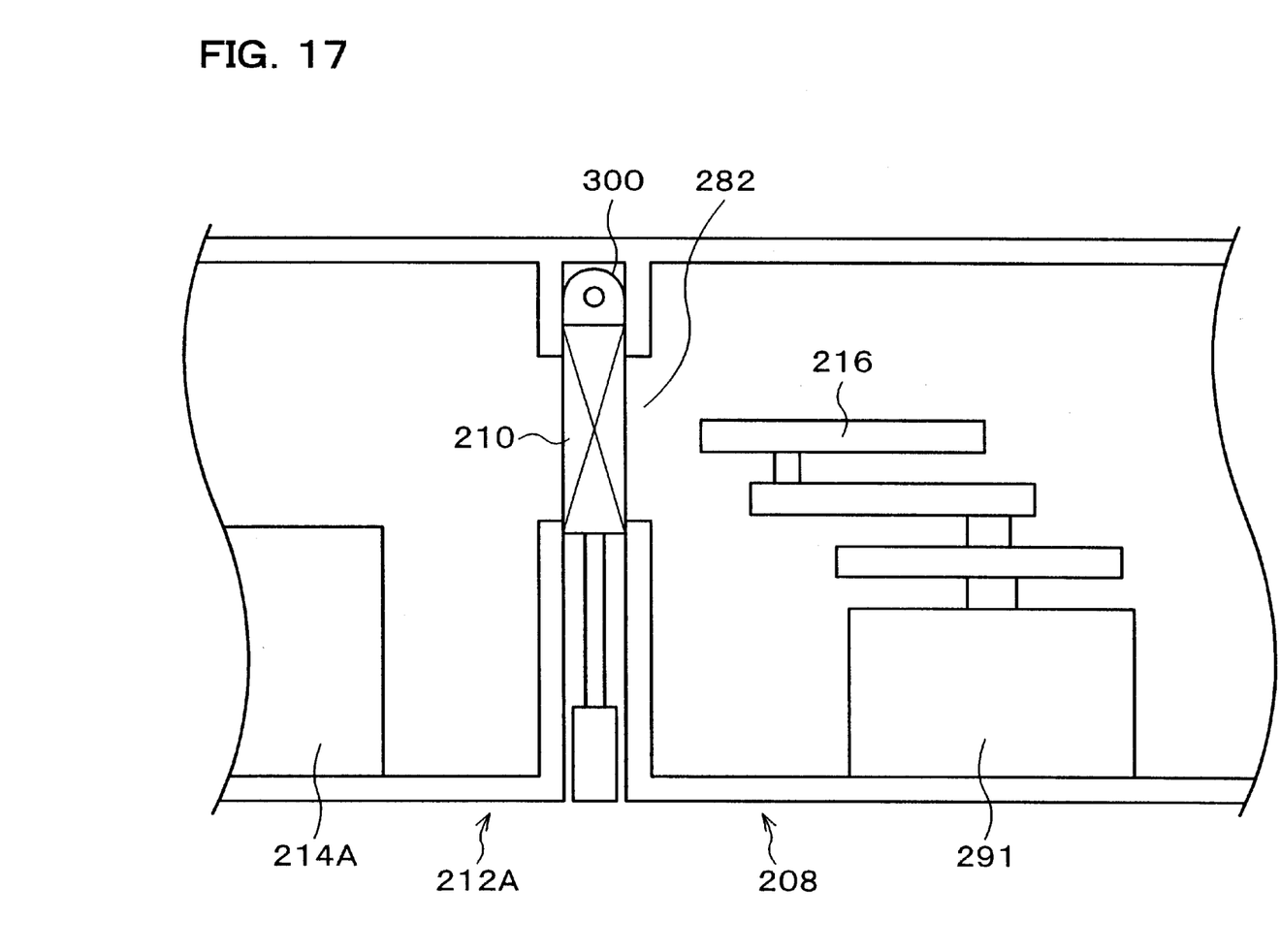
FIG. 17 is a vertical section showing another embodiment of a processing apparatus of the present invention.

As shown in FIG. 17, the ultraviolet-light irradiation unit 300 may be disposed just above the gate valve 210.

INDUSTRIAL APPLICABILITY

The present invention is applicable to a process for fabricating semiconductor devices and particularly to a processing apparatus and method for, for example, subjecting an object to be processed, such as a silicon wafer, to CVD and etching. More particularly, the invention is applicable to a processing apparatus and method involving irradiation of the surface of an object to be processed with ultraviolet light.

What is claimed is:

1. A processing apparatus comprising:
    a transfer chamber having a transfer means for transferring an object to be processed;
    one or more vacuum processing chambers disposed around said transfer chamber in which the object is processed;
    a gate valve communicating between said transfer chamber and said vacuum processing chambers; and
    one or more ultraviolet-light irradiation apparatuses disposed frontward or rearward of said gate valve in a transfer path extending between each of said processing chambers and said transfer chamber.

2. The processing apparatus of claim 1, wherein said ultraviolet-light irradiation apparatuses are disposed above the object transfer path located within each of said processing chambers.

3. The processing apparatus of claim 2, wherein said ultraviolet-light irradiation apparatuses are disposed above the object transfer path located within said transfer chamber.

4. The processing apparatus of claim 2, wherein said ultraviolet-light irradiation apparatuses comprise an ultraviolet-light irradiation unit disposed above the object transfer path located within each of said processing chambers and an ultraviolet-light irradiation unit disposed above the object transfer path located within said transfer chamber.

5. The apparatus of claim 1, further comprising a pretreatment chamber disposed in said transfer chamber, wherein said pretreatment chamber comprises gas supply means for supplying thereinto a processing gas to be activated by ultraviolet light from one or more of said ultraviolet-light irradiation apparatuses.

6. A method for processing an object to be processed by employing a processing apparatus comprising a transfer chamber having a transfer means for transferring an object to be processed, one or more vacuum processing chambers disposed around said transfer chamber in which the object is processed, a gate valve communicating between said transfer chamber and said vacuum processing chambers, and one or more ultraviolet-light irradiation apparatuses disposed frontward or rearward of said gate valve in a transfer path extending between each of said processing chambers and said transfer chamber, said method for processing comprising:

turning on irradiation of the object with ultraviolet light by said ultraviolet-light irradiation apparatuses before said transfer means holding the object passes through said gate valve, and turning off irradiation of the object after said transfer means holding the object passes through said gate valve after said transfer means holding the object passes through the gate valve as said transfer means holding the object enters each of said chambers from said transfer chamber; and turning off irradiation with ultraviolet light by said ultraviolet-light irradiation apparatuses when said transfer means holding no object to be processed returns from said processing chambers to said transfer chamber.

7. A method for processing an object to be processed by employing a processing apparatus comprising a transfer chamber having a transfer means for transferring an object to be processed, one or more vacuum processing chambers disposed around said transfer chamber in which the object is processed, a gate valve communicating between said transfer chamber and said vacuum processing chambers, and one or more ultraviolet-light irradiation apparatuses disposed frontward or rearward of said gate valve in a transfer path extending between each of said processing chambers and said transfer chamber, said method for processing comprising:

turning off ultraviolet irradiation by said ultraviolet-light irradiation apparatuses when said transfer means holding no object to be processed enters each of said processing chambers from said transfer chamber; and turning on the irradiation of the object with ultraviolet light by said ultraviolet-light irradiation apparatuses while said transfer means holding the object passes through said gate valve as said transfer means holding the object returns from each of said processing chambers to said transfer chamber.

* * * * *